United States Patent
Tsai et al.

(10) Patent No.: US 12,310,027 B2
(45) Date of Patent: *May 20, 2025

(54) SEMICONDUCTOR DEVICE AND METHOD OF MANUFACTURING THE SAME

(71) Applicant: TAIWAN SEMICONDUCTOR MANUFACTURING COMPANY LTD., Hsinchu (TW)

(72) Inventors: Yu-Ting Tsai, Hsinchu (TW); Ching-Tzer Weng, Tainan (TW); Tsung-Hua Yang, Tainan (TW); Kao-Chao Lin, Chiayi County (TW); Chi-Wei Ho, Tainan (TW); Chia-Ta Hsieh, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/595,464

(22) Filed: Mar. 5, 2024

(65) Prior Publication Data

US 2024/0206184 A1    Jun. 20, 2024

Related U.S. Application Data

(63) Continuation of application No. 17/340,112, filed on Jun. 7, 2021, now Pat. No. 11,950,424.

(51) Int. Cl.
*H10B 43/40*    (2023.01)
*H10B 43/30*    (2023.01)

(52) U.S. Cl.
CPC ............. *H10B 43/40* (2023.02); *H10B 43/30* (2023.02)

(58) Field of Classification Search
CPC ......... H10B 43/40; H10B 43/30; H01L 29/78; H01L 29/6656; H01L 29/792; H01L 29/40117

See application file for complete search history.

(56) References Cited

U.S. PATENT DOCUMENTS

| | | | | |
|---|---|---|---|---|
| 7,696,084 B2* | 4/2010 | Saeki | ...................... | H10B 69/00 438/622 |
| 7,872,299 B2* | 1/2011 | Won | ...................... | H10B 43/30 257/326 |
| 8,471,328 B2* | 6/2013 | Chen | ................. | H01L 29/40117 257/314 |
| 8,866,212 B2* | 10/2014 | Tan | ................... | H01L 29/40117 257/326 |

* cited by examiner

*Primary Examiner* — Allison Bernstein
(74) *Attorney, Agent, or Firm* — WPAT LAW; Anthony King

(57) ABSTRACT

A semiconductor device and method of manufacturing the same are provided. The semiconductor device includes a substrate and a first gate electrode disposed on the substrate and located in a first region of the semiconductor device. The semiconductor device also includes a first sidewall structure covering the first gate electrode. The semiconductor device further includes a protective layer disposed between the first gate electrode and the first sidewall structure. In addition, the semiconductor device includes a second gate electrode disposed on the substrate and located in a second region of the semiconductor device. The semiconductor device also includes a second sidewall structure covering a lateral surface of the second gate electrode.

20 Claims, 17 Drawing Sheets

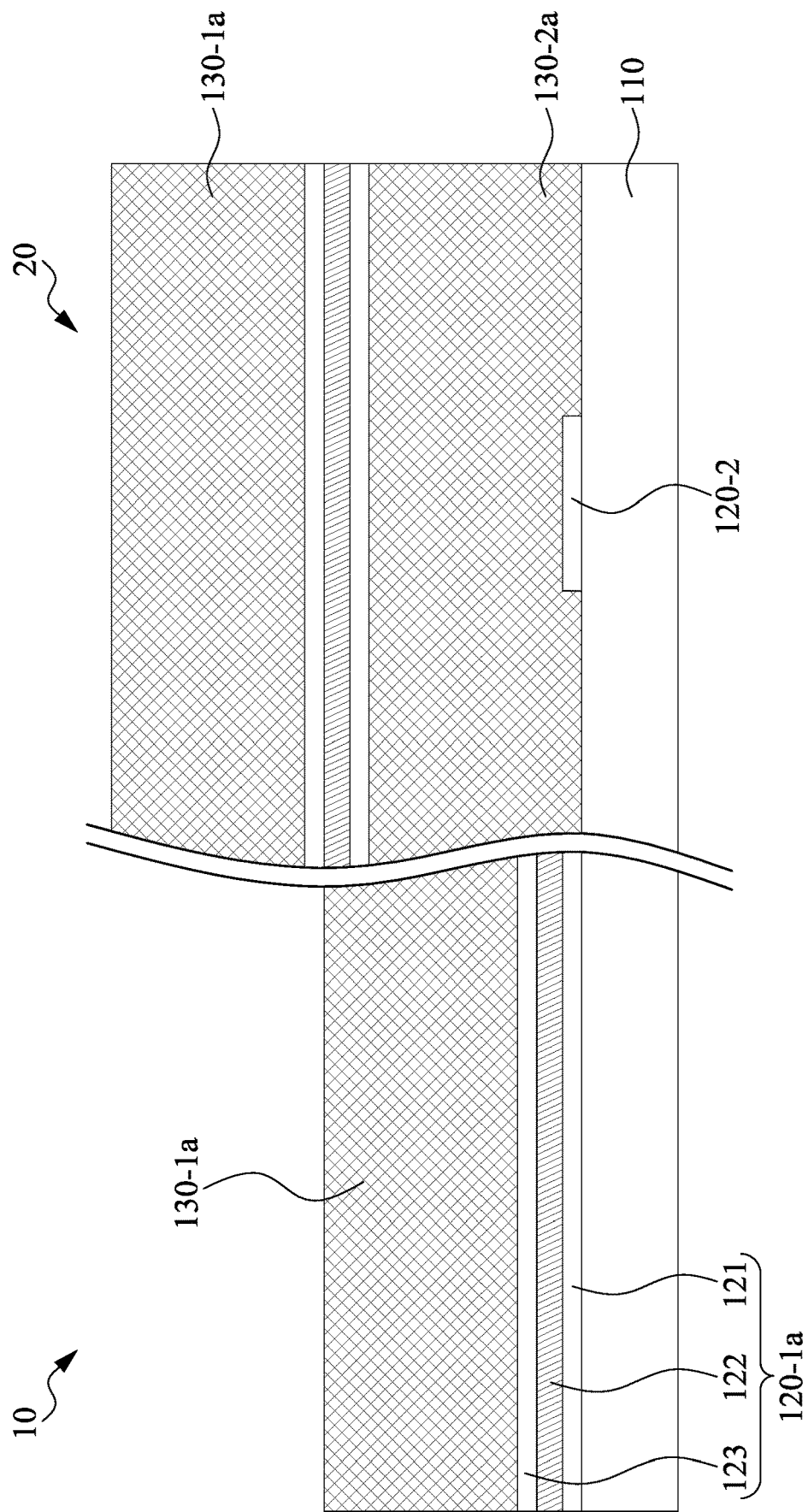

SEMICONDUCTOR DEVICE AND METHOD OF MANUFACTURING THE SAME

CROSS-REFERENCE TO RELATED APPLICATIONS

This application is a continuation of U.S. application Ser. No. 17/340,112, filed on Jun. 7, 2021. The above-referenced application is hereby incorporated herein by reference in their entirety.

BACKGROUND

Flash memory is an electronic non-volatile computer storage medium that can be electrically erased and reprogrammed. It is used in a wide variety of commercial and military electronic devices and equipment. To store information, flash memory includes an addressable array of memory cells, typically made from floating gate transistors. Common types of flash memory cells include stacked gate memory cells and split gate memory cells. Split gate memory cells have several advantages over stacked gate memory cells, such as lower power consumption, higher injection efficiency, less susceptibility to short channel effects, and over erase immunity.

The integration of the flash memory cell device and the logic device may improve the manufacturing costs, manufacturing procedures, and the performance of device. However, the integration of flash memory cell device and the logic device may also increase process complexity and result in degradation of the performance of the flash memory cell device.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, and FIG. 4M illustrate various stages of manufacturing a semiconductor device, in accordance with some embodiments of the present disclosure.

DETAILED DESCRIPTION

Figure 1:
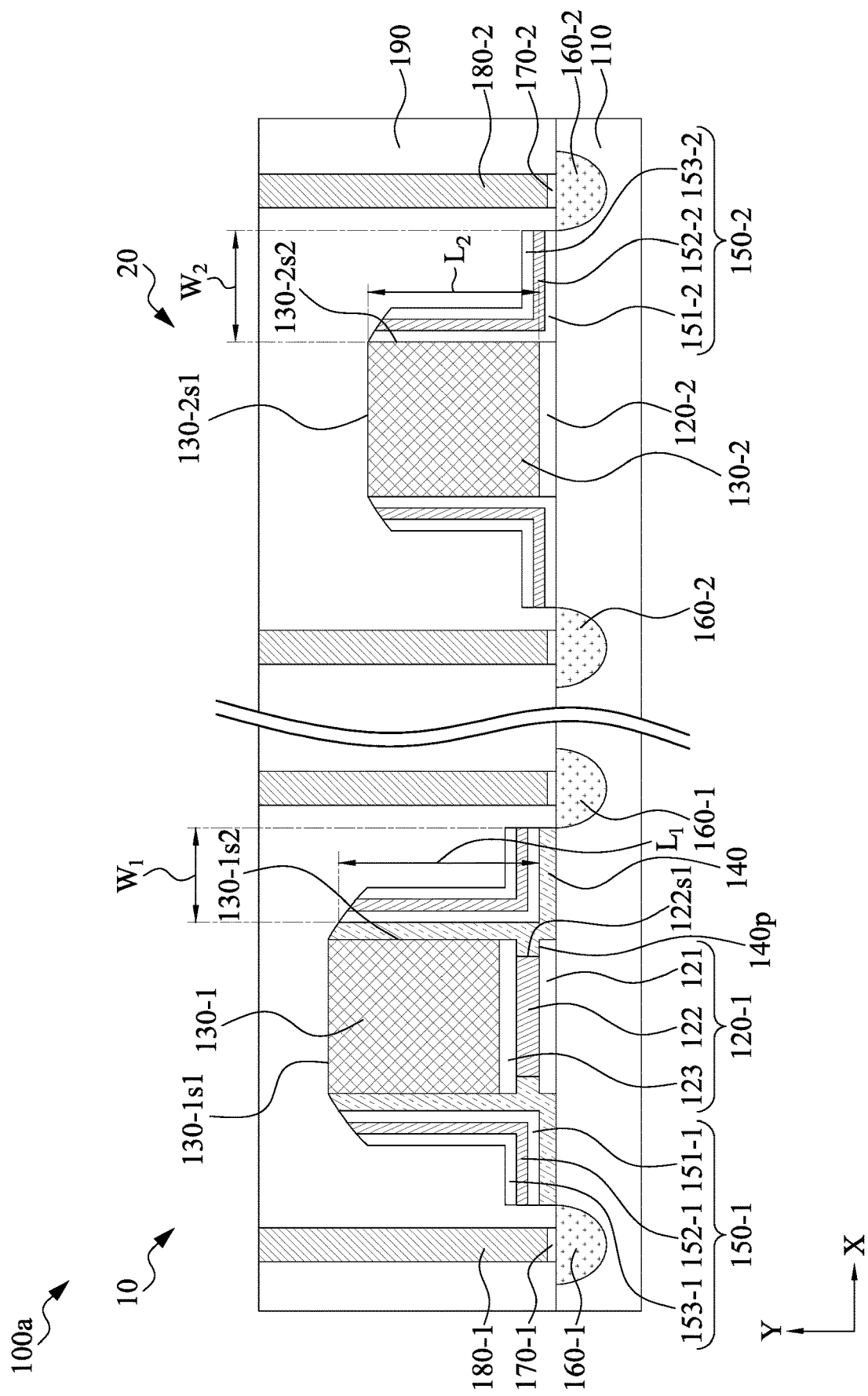
FIG. 1 illustrates a cross-sectional view of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A trend in the semiconductor manufacturing industry is to integrate different semiconductor components of a composite semiconductor device into a common semiconductor structure. Such integration advantageously lowers manufacturing costs, simplifies manufacturing procedures, and increases operational speed. One type of composite semiconductor device often integrated into a common semiconductor structure is a flash memory device. A flash memory device includes an array of flash memory cell devices and logic devices supporting operation of the flash memory cell devices.

FIG. 1 illustrates a cross-sectional view of a semiconductor device 100a, in accordance with some embodiments of the present disclosure. In some embodiments, the semiconductor device 100a includes a region 10 and a region 20. Each of the regions may include a device, such as a logic device, a flash memory cell device, a high voltage device, a low voltage device, or other devices.

In some embodiments, the region 10 may include a flash memory cell device, and the region 20 may include a logic device. The flash memory cell device may include, for example, a stacked gate flash memory cell device, a split gate flash memory cell device, or other flash memory cell device. In some embodiments, the region 10 can include a silicon-oxide-nitride-oxide-silicon (SONOS) flash memory cell device, a metal-oxide-nitride-oxide-silicon (MONOS) flash memory cell device, or a third generation SUPER-FLASH (ESF3) memory cell devices. The region 10 can be separated from the region 20 by isolation structures (not shown). The isolation structure may include, for example, a shallow trench isolation (STI), a local oxidization of silicon (LOCOS) structure, a deep trench isolation (DTI) or any other suitable isolation structures. It is appreciated that some elements are omitted for clarity, and each of the region 10 and region 20 may have more elements. For example, each of the region 10 and region 20 may include well regions or other doped regions, additional gate structures or other elements.

As shown in FIG. 1, the semiconductor device 100a may include a substrate 110. The substrate 110 may be a semiconductor substrate, such as a bulk semiconductor, a semiconductor-on-insulator (SOI) substrate, or the like, which may be doped (e.g., with p type or n type dopants) or undoped. The substrate 110 can include an elementary semiconductor material including silicon or germanium in a single crystal form, a polycrystalline form, or an amorphous form. The substrate 110 can include a compound semiconductor material including at least one of silicon carbide, gallium arsenide, gallium phosphide, indium phosphide, indium arsenide, or indium antimonide. The substrate 110 can include an alloy semiconductor material including at least one of SiGe, GaAsP, AlInAs, AlGaAs, GaInAs, GaInP, or GaInAsP. The substrate 110 can include any other suitable material, or a combination thereof. In some embodiments, the alloy semiconductor substrate may include a SiGe alloy with a gradient Ge feature in which the Si and Ge composition changes from one ratio at one location to another ratio at another location of the gradient SiGe feature. In another embodiment, the SiGe alloy can be formed over a silicon substrate. In some embodiments, a SiGe alloy can be mechanically strained by another material in contact with the SiGe alloy. In some embodiments, the substrate 110 may have a multilayer structure, or the substrate 110 may include a multilayer compound semiconductor structure.

In some embodiments, the substrate 110 may include multiple doped regions (not shown) with n type and/or p type dopants in the regions 10 and 20. In some embodiments, n type dopants include arsenic (As), phosphorus (P), other group V elements, or any combination thereof. In some embodiments, p type dopants include boron (B), other group III elements, or any combination thereof.

In some embodiments, the region 10 of the semiconductor device 100a includes a gate dielectric structure 120-1 (or a charge trapping dielectric structure).

The gate dielectric structure 120-1 includes a multi-layer dielectric structure configured to store (or trap) different amounts of charge, which respectively correspond to a data state (e.g., representing a logical "0" or a logical "1"). In some embodiments, the gate dielectric structure 120-1 includes a layer 121 (or a tunnel dielectric layer) disposed on the substrate 110, a layer 122 (or a charge trapping layer) disposed on the layer 121, and a layer 123 (or a blocking dielectric layer) disposed on the layer 122. In some embodiments, the gate dielectric structure 120-1 may include an ONO structure. In such embodiments, the layer 121 may include an oxide (e.g., $SiO_2$), the layer 122 may include a nitride (e.g., $Si_3N_4$), and the layer 123 may include an oxide (e.g., $SiO_2$).

In other embodiments, the gate dielectric structure 120-1 may include an oxide-nano-crystal-oxide (ONCO) structure. In such embodiments, the layer 121 may include an oxide, the layer 122 may include a layer of crystal nano-dots (e.g., silicon dots), and the layer 123 may include an oxide. In some embodiments, the lateral surface 122s1 of the layer 122 can be misaligned to that of the layer 123. In some embodiments, the lateral surface 122s1 of the layer 122 can be misaligned to that of the layer 121. In some embodiments, the lateral surface 122s1 of the layer 122 can be recessed with respective to those of the layers 121 and 123.

In some embodiments, the region 10 of the semiconductor device 100a include a gate electrode 130-1. The gate electrode 130-1 is disposed on the gate dielectric structure 120-1. The gate electrode 130-1 may include polysilicon, silicon-germanium, and at least one metallic material including elements and compounds such as Mo, Cu, W, Ti, Ta, TiN, TaN, NiSi, CoSi, or other suitable conductive materials. The gate electrode 130-1 may be configured to read the charge stored in the gate dielectric structure 120-1. When a bias voltage is applied to the gate electrode 130-1, the charge stored in the gate dielectric structure 120-1 can be read.

In some embodiments, the region 10 of the semiconductor device 100a includes a protective layer 140. In some embodiments, the protective layer 140 is disposed on the lateral surface 130-1s2 of the gate electrode 130-1. In some embodiments, the protective layer 140 is in contact with the lateral surface 130-1s2 of the gate electrode 130-1. In some embodiments, the protective layer 140 is disposed on and in contact with the lateral surface of the gate dielectric structure 120-1. For example, the protective layer 140 can be disposed on and in contact with the lateral surface 122s1 of the layer 122. In some embodiments, the protective layer 140 is disposed on and in contact with the upper surface of the substrate 110.

The protective layer 140 is configured to cover the lateral surface of the gate dielectric structure 120-1 (e.g., the lateral surface 122s1 of the layer 122) to prevent the layer 122 from being etched during the processes of manufacturing the semiconductor device 100a, which will be described in the subsequent paragraphs.

In some embodiments, the protective layer 140 may have a relatively greater etch resistance to an etchant, such as phosphoric acid ($H_3PO_4$) which is used to remove nitride-containing material (e.g., silicon nitride, oxynitride or other nitride-containing materials). That is, in comparison with nitride-containing materials (e.g., the layer 122), the protective layer 140 has a greater resistance to $H_3PO_4$. In some embodiments, the protective layer 140 may include oxide, such as silicon oxide and metal oxide; sulfide, such as silicon sulfide; carbide; or other suitable materials. In some embodiments, the protective layer 140 has a protruding portion 140p in contact with the layer 122 and located between the layer 121 and the layer 123.

In some embodiments, the region 10 of the semiconductor device 100a includes a sidewall structure 150-1. The sidewall structure 150-1 extends vertically up from the substrate 110. The sidewall structure 150-1 can be taller than or substantially similar height to the top surface 130-1s1 of the gate electrode 130-1. The sidewall structure 150-1 is disposed on the lateral surface 130-1s2 of the gate electrode 130-1. In some embodiments, the sidewall structure 150-1 is spaced apart from the gate electrode 130-1 and the gate dielectric structure 120-1 by the protective layer 140. In some embodiments, the sidewall structure 150-1 includes a multi-layer dielectric structure. The sidewall structure 150-1 may include a dielectric layer 151-1 disposed on the protective layer 140, a dielectric layer 152-1 disposed on the dielectric layer 151-1, and a dielectric layer 153-1 disposed on the dielectric layer 152-1. In some embodiments, the sidewall structure 150-1 may include an ONO structure. In such embodiments, the dielectric layer 151-1 may include an oxide (e.g., $SiO_2$), the dielectric layer 152-1 may include a nitride (e.g., $Si_3N_4$), and the dielectric layer 153-1 may include an oxide (e.g., $SiO_2$).

In some embodiments, the region 10 of the semiconductor device 100a includes source/drain regions 160-1. The source/drain regions 160-1 are disposed in the substrate 110. The source/drain regions 160-1 are disposed on two opposite sides of the gate electrode 130-1.

In some embodiments, the region 10 of the semiconductor device 100a includes silicide structures 170-1. The silicide structures 170-1 are disposed on the source/drain regions 160-1. In some embodiments, the region 10 of the semiconductor device 100a includes contacts 180-1. The contact 180-1 is electrically connected to the source/drain regions 160-1. The contact 180-1 may include multi-layer structure. The contact 180-1 may include conductive materials, such as metal, metal nitride, alloy or other suitable materials.

The silicide structure 170-1 is configured to reduce resistance between the source/drain regions 160-1 and the electrical conductor (e.g., contact 180-1) by providing a better and lower resistance contact surface. The silicide structure 170-1 may include, for example, nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridum silicide (IrSi), erbium silicide (ErSi), cobalt silicide (CoSi), other suitable materials, or a combination thereof.

In some embodiments, the region 20 of the semiconductor device 100a includes a gate dielectric structure 120-2. In some embodiments, the gate dielectric structure 120-2 includes a single layer structure. The gate dielectric structure 120-2 may include silicon oxide or other suitable materials. In other embodiments, the gate dielectric structure 120-2 may include a high-k (dielectric constant greater than 4) dielectric layer. The high-k dielectric layer can include high-k dielectric material such as $HfO_2$, HfSiO, HfSiON, HfTaO, HfTiO, HfZrO, other suitable high-k dielectric materials, or a combination thereof. In some embodiments, the high-k dielectric material can further be selected from metal oxides, metal nitrides, metal silicates, transition metal-oxides, transition metal-nitrides, transition-metal silicates, metal oxynitrides, metal aluminates, or combinations thereof. In some embodiments, the component of the gate dielectric structure 120-1 can be different from that of the gate dielectric structure 120-2.

In some embodiments, the region 20 of the semiconductor device 100a includes a gate electrode 130-2. The gate electrode 130-2 is disposed on the gate dielectric structure 120-2. The gate electrode 130-2 may include polysilicon, silicon-germanium, or other suitable conductive materials. In some embodiments, the gate electrode 130-2 includes a work function metal layer that provides a metal gate with an n type-metal work function or p type-metal work function. The n type-metal work function materials include materials such as hafnium zirconium, titanium, tantalum, aluminum, metal carbides (e.g., hafnium carbide, zirconium carbide, titanium carbide, and aluminum carbide), aluminides, or other suitable materials. The p type-metal work function materials include materials such as ruthenium, palladium, platinum, cobalt, nickel, conductive metal oxide, or other suitable materials.

In some embodiments, the region 20 of the semiconductor device 100a includes a sidewall structure 150-2. The sidewall structure 150-2 extends vertically up from the substrate 110. The sidewall structure 150-2 can be taller than or substantially similar height to the top surface 130-2s1 of the gate electrode 130-2. The sidewall structure 150-2 is disposed on the lateral surface 130-2s2 of the gate electrode 130-2.

In some embodiments, the sidewall structure 150-2 is in contact with the lateral surface 130-2s2 of the gate electrode 130-2. In some embodiments, the sidewall structure 150-2 includes a multi-layer dielectric structure. The sidewall structure 150-2 may include a dielectric layer 151-2 disposed on the lateral surface 130-2s2 of the gate electrode 130-2, a dielectric layer 152-2 disposed on the dielectric layer 151-2, and a dielectric layer 153-2 disposed on the dielectric layer 152-2.

In some embodiments, the sidewall structure 150-2 may include an ONO structure. In such embodiments, the dielectric layer 151-2 may include an oxide (e.g., $SiO_2$), the dielectric layer 152-2 may include a nitride (e.g., $Si_3N_4$), and the dielectric layer 153-2 may include an oxide (e.g., $SiO_2$). In some embodiments, the sidewall structure 150-1 has a structure substantially identical to that of the sidewall structure 150-2. In some embodiments, width $W_1$ of the sidewall structure 150-1 is substantially identical to width $W_2$ of the sidewall structure 150-2 along the X direction. In some embodiments, length $L_1$ of the dielectric layer 151-1 is different from length $L_2$ of the dielectric layer 151-2 along the Y direction. In some embodiments, length $L_1$ of the dielectric layer 151-1 is greater than length $L_2$ of the dielectric layer 151-2 along the Y direction.

In some embodiments, the length of the dielectric layer 152-1 is different from the length of the dielectric layer 152-2 along the Y direction. In some embodiments, the length of the dielectric layer 152-1 is greater than the length of the dielectric layer 152-2 along the Y direction.

In some embodiments, the region 20 of the semiconductor device 100a includes source/drain regions 160-2. The source/drain regions 160-2 are disposed in the substrate 110. The source/drain regions 160-2 are disposed on two opposite sides of the gate electrode 130-2.

In some embodiments, the region 20 of the semiconductor device 100a includes silicide structures 170-2. The silicide structures 170-2 are disposed on the source/drain regions 160-2. The silicide structure 170-2 may have a structure and/or material similar to or substantially identical to that of the silicide structure 170-1.

In some embodiments, the region 20 of the semiconductor device 100a includes contacts 180-2. The contact 180-2 is electrically connected to the source/drain regions 160-2. The contact 180-2 may have a structure and/or material similar to or substantially identical to that of the contact 180-1.

In some embodiments, the semiconductor device 100a includes an inter-layer dielectric (ILD) 190, The ILD 190 is disposed on the substrate 110. The ILD 190 may include an oxide, PSG, a low k dielectric (which has a dielectric constant less than about 4) or some other dielectrics.

Figure 2:
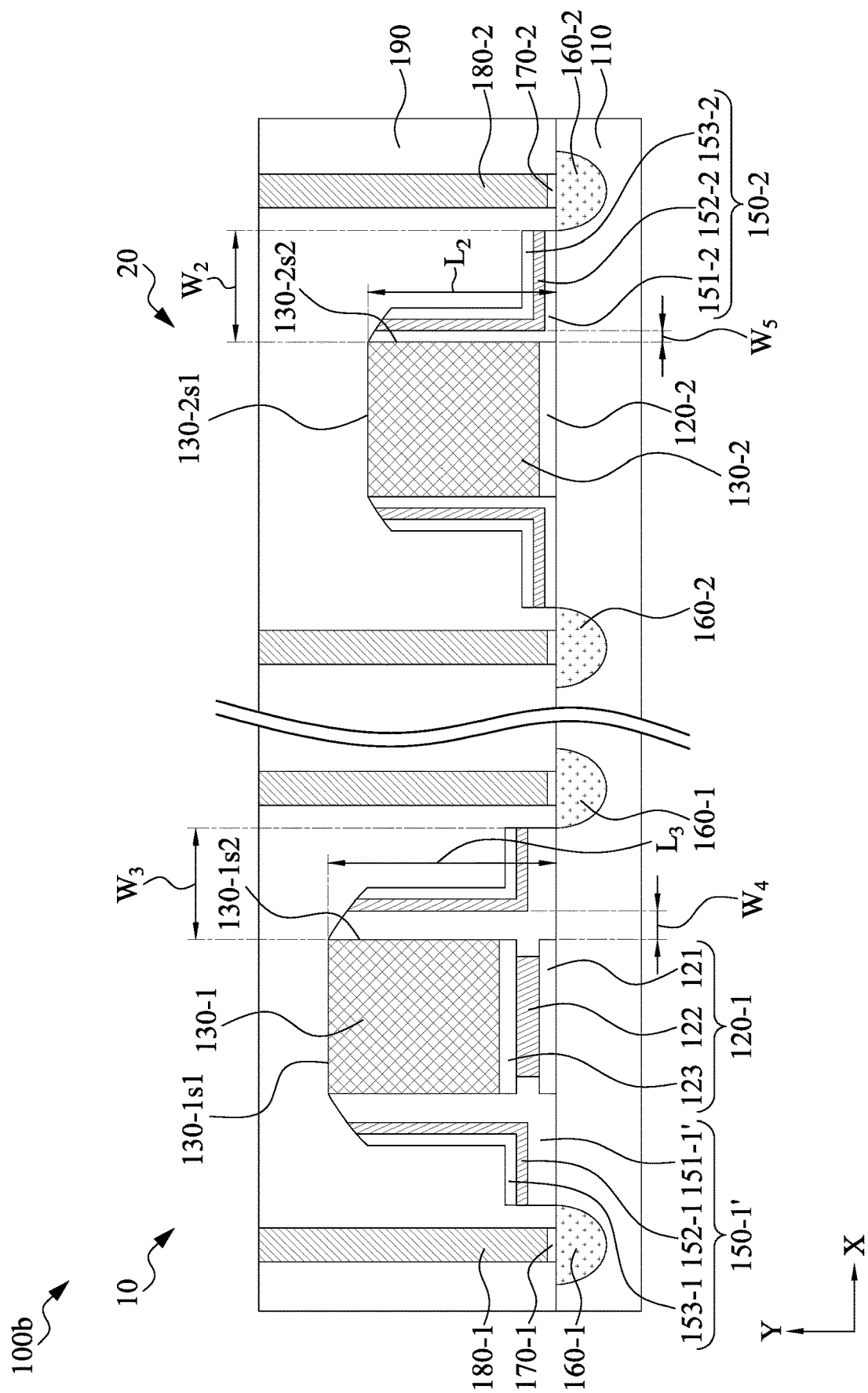
FIG. 2 illustrates a cross-sectional view of a semiconductor device, in accordance with some embodiments of the present disclosure.

FIG. 2 illustrates a cross-sectional view of a semiconductor device 100b, in accordance with some embodiments of the present disclosure. The semiconductor device 100b has a structure similar to that of the semiconductor device 100a, and one of the differences is that the semiconductor device 100b includes sidewall structures 150-1'.

The dielectric layer 151-1 and the protective layer 140 of the semiconductor device 100a correspond to the dielectric layer 151-1' of the semiconductor device 100b.

In some embodiments, for the semiconductor device 100a, the material of the protective layer 140 is identical to that of the dielectric layer 151-1. In such embodiments, the boundary (or interface) between the protective layer 140 and the layer of the sidewall structure that is in contact with the protective layer (e.g., the layer 151-1 as shown in FIG. 1) is unobvious or cannot be identified by a Scanning Electron Microscope (SEM) or Transmission Electron Microscopy (TEM). For example, both the protective layer 140 and the layer 151-1 may be made of $SiO_2$, and their interface cannot be identified by SEM or TEM. In some embodiments, the protective layer 140 and the layer 151-1 may be collectively regarded as a dielectric layer 151-1' of the sidewall structure 150-1'. In such embodiments, the protective layer 140 may be regarded as a portion of the sidewall structure 150-1'.

In some embodiments, width $W_3$ of the sidewall structure 150-1' is different from width $W_2$ of the sidewall structure 150-2 along the X direction. In some embodiments, width $W_3$ of the sidewall structure 150-1' is greater than width $W_2$ of the sidewall structure 150-2. In some embodiments, the size of the sidewall structure 150-1' is greater than that of the sidewall structure 150-2. In some embodiments, width $W_4$ of the dielectric layer 151-1' is different from width $W_5$ of the dielectric layer 151-2 along the X direction. In some embodiments, width $W_4$ of the dielectric layer 151-1' is greater than width $W_5$ of the dielectric layer 151-2 along the X direction.

In some embodiments, the ratio between width $W_3$ of the sidewall structure 150-1' and width $W_2$ of the sidewall structure 150-2 ranges from about 1.02 to about 1.5, such as 1.02, 1.05, 1.07, 1.1, 1.2, 1.3, 1.4, or 1.5. In some embodiments, the distance between the dielectric layer 152-1 and the gate electrode 130-1 is substantially equal to $W_4$, and the distance between the dielectric layer 152-2 and the gate electrode 130-2 is substantially equal to $W_5$. In some embodiments, the distance between the dielectric layer 152-1 and the gate electrode 130-1 is different from the distance between the dielectric layer 152-2 and the gate electrode 130-2 along the X direction. In some embodiments, the distance between the dielectric layer 152-1 and the gate electrode 130-1 is greater than the distance between the dielectric layer 152-2 and the gate electrode 130-2. In some embodiments, length $L_3$ of the dielectric layer 151-1' is greater than length $L_2$ of the dielectric layer 151-2 along the Y direction.

Figure 3A:
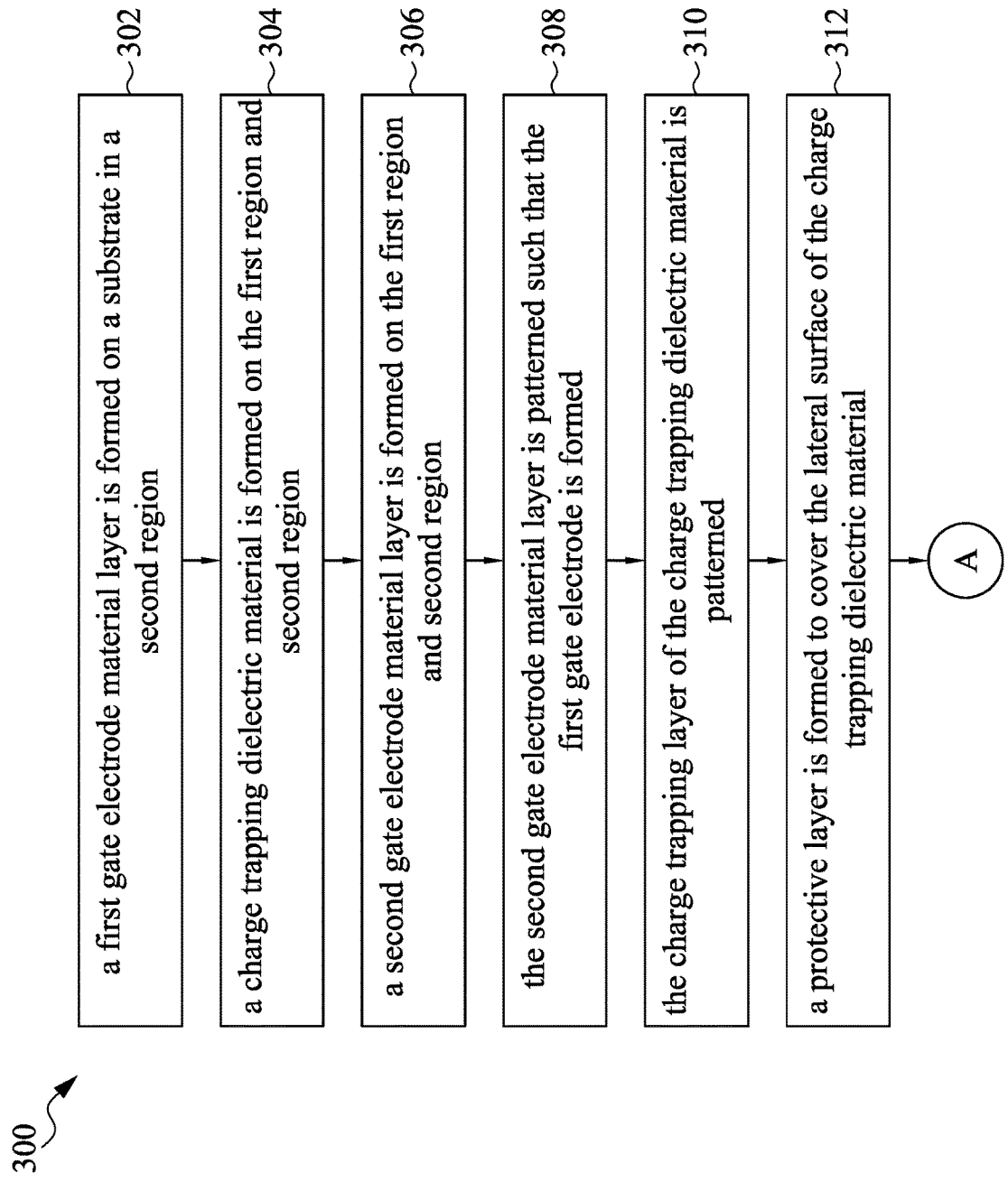
FIGS. 3A and 3B are flow charts illustrating a method for manufacturing a semiconductor device, in accordance with various aspects of the present disclosure.
Figure 3B:
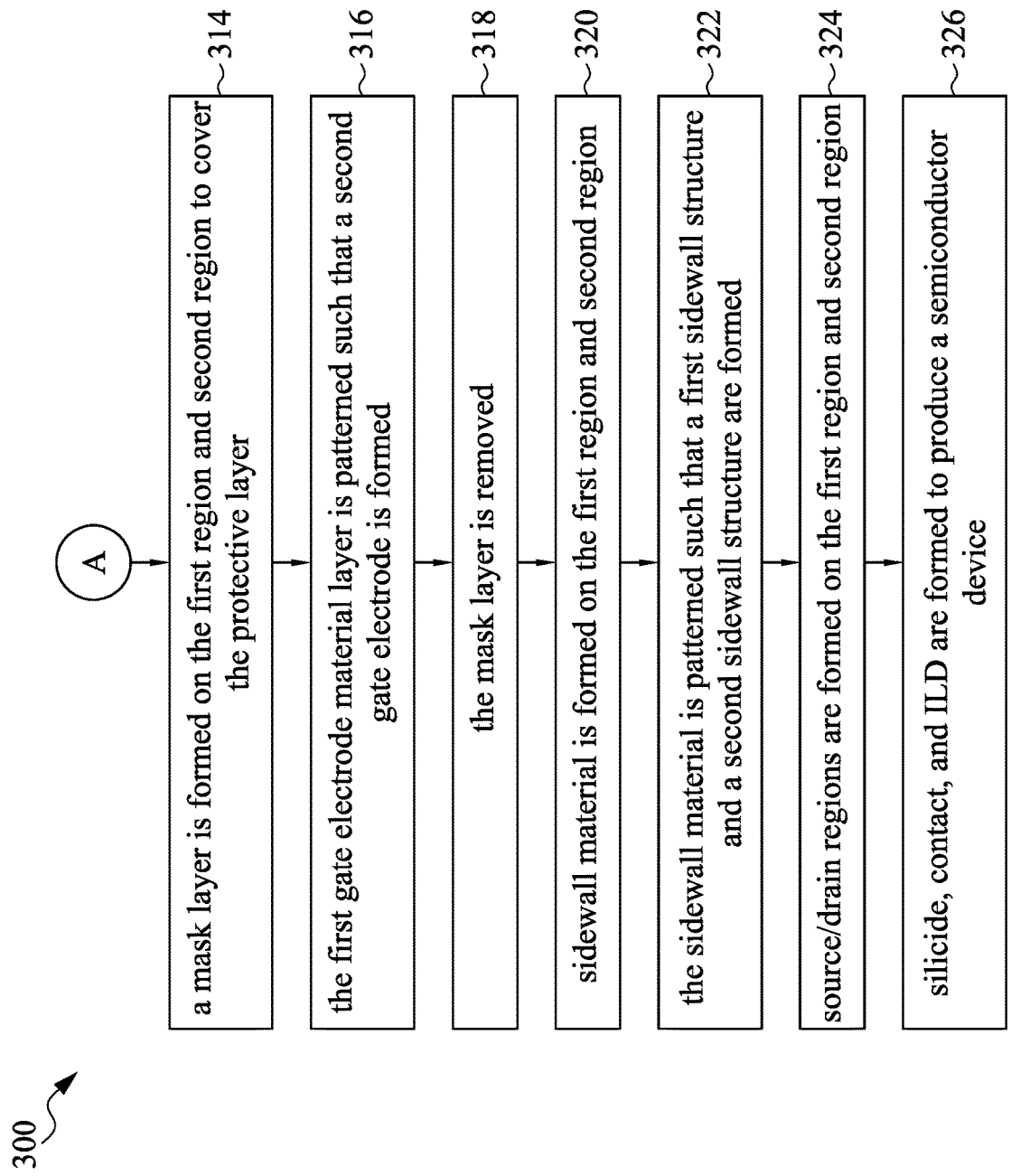

FIG. 3A and FIG. 3B are flow charts illustrating a method 300 for manufacturing a semiconductor device, which has a first region (e.g., which includes a flash memory cell device) and a second region (e.g., which includes a logic device) according to various aspects of the present disclosure.

Referring to FIG. 3A, the method 300 begins with operation 302 in which a first gate electrode material layer is formed on a substrate in the second region. The method 300 continues with operation 304 in which a charge trapping dielectric material is formed on the first region and second region to cover the first gate electrode material layer. The charge trapping dielectric material includes a tunnel dielectric layer, a charge trapping layer, and a blocking dielectric layer.

The method 300 continues with operation 306 in which a second gate electrode material layer is formed on the first region and second region. The method 300 continues with operation 308 in which the second gate electrode material layer is patterned such that the first gate electrode is formed. Further, the second gate electrode material layer in the second region is removed, and the blocking dielectric layer of the charge trapping dielectric material is patterned.

The method 300 continues with operation 310 in which the charge trapping layer of the charge trapping dielectric material is patterned. The method 300 continues with operation 312 in which a protective layer is formed to cover the lateral surface of the charge trapping dielectric material. Specifically, the protective layer covers a lateral surface of the charge trapping layer.

Referring to FIG. 3B, the method 300 continues with operation 314 in which a mask layer is formed on the first region and second region to cover the protective layer. The method 300 continues with operation 316 in which the first gate electrode material layer is patterned such that a second gate electrode is formed. The method 300 continues with operation 318 in which the mask layer is removed. The method 300 continues with operation 320 in which a sidewall material is formed on the first region and second region. The method 300 continues with operation 322 in which the sidewall material is patterned such that a first sidewall structure and a second sidewall structure are formed. The method 300 continues with operation 324 in which source/drain regions are formed on the first region and second region. The method 300 continues with operation 326 in which silicide structures, contacts, and an ILD are formed to produce a semiconductor device.

The method 300 is merely an example, and is not intended to limit the present disclosure beyond what is explicitly recited in the claims. Additional operations can be provided before, during, or after each operations of the method 300, and some operations described can be replaced, eliminated, or moved around for additional embodiments of the method.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, and FIG. 4M illustrate various stages of manufacturing a semiconductor device, in accordance with some embodiments of the present disclosure. The semiconductor device has a region 10 (e.g., which includes a flash memory cell device) and a region 20 (e.g., which includes a logic device).

Figure 4A:
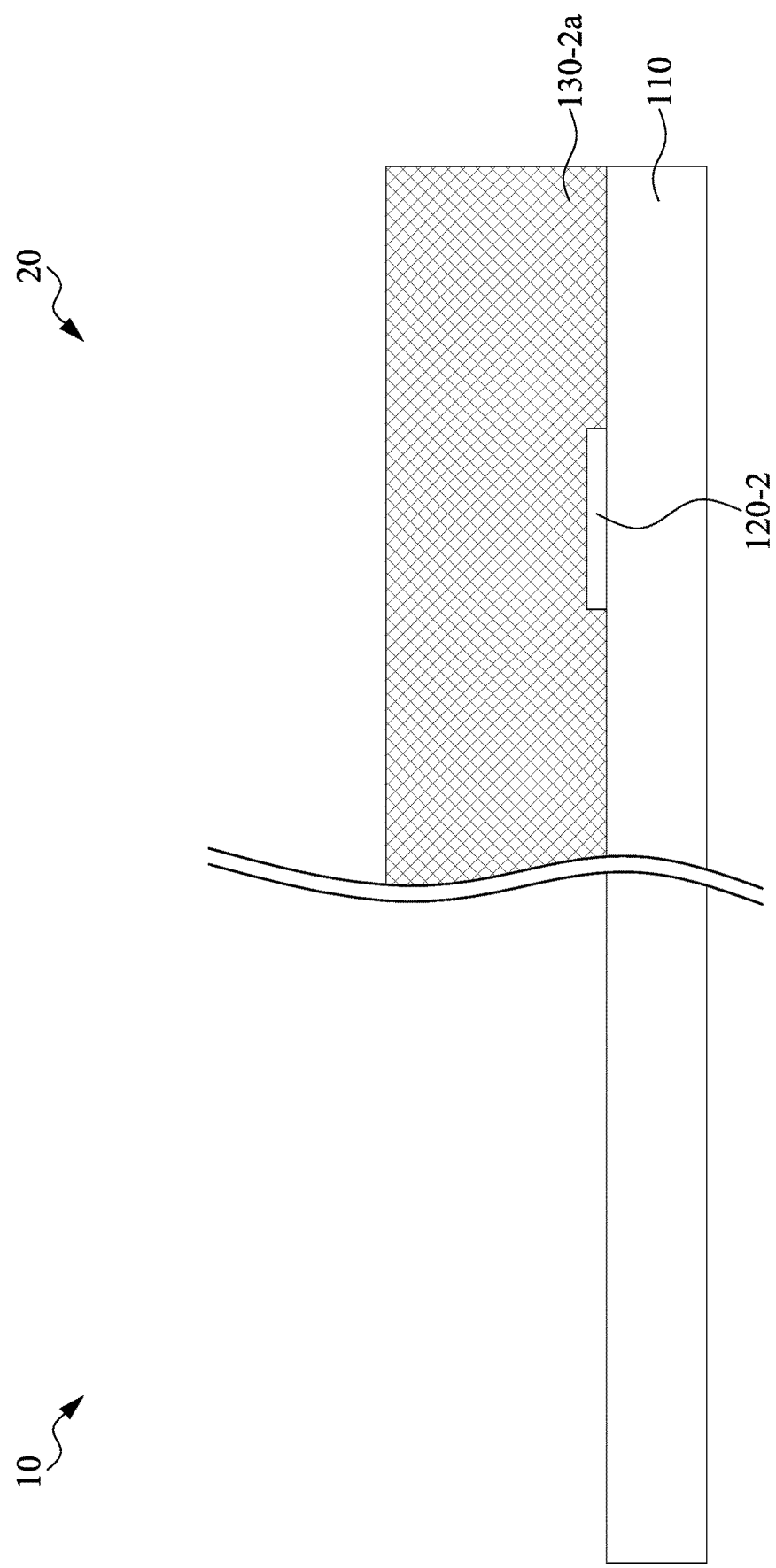

Referring to FIG. 4A and operation 302 in FIG. 3A, a gate electrode material layer 130-2a is formed on a substrate 110 in the region 20. A gate dielectric structure 120-2 is formed on the substrate 110 and located in the region 20. The gate electrode material layer 130-2a is formed on the gate dielectric structure 120-2. The gate electrode material layer 130-2a may be formed by a deposition process (e.g., chemical vapor deposition (CVD), physical vapor deposition (PVD), and/or atomic layer deposition (ALD).

Figure 4B:
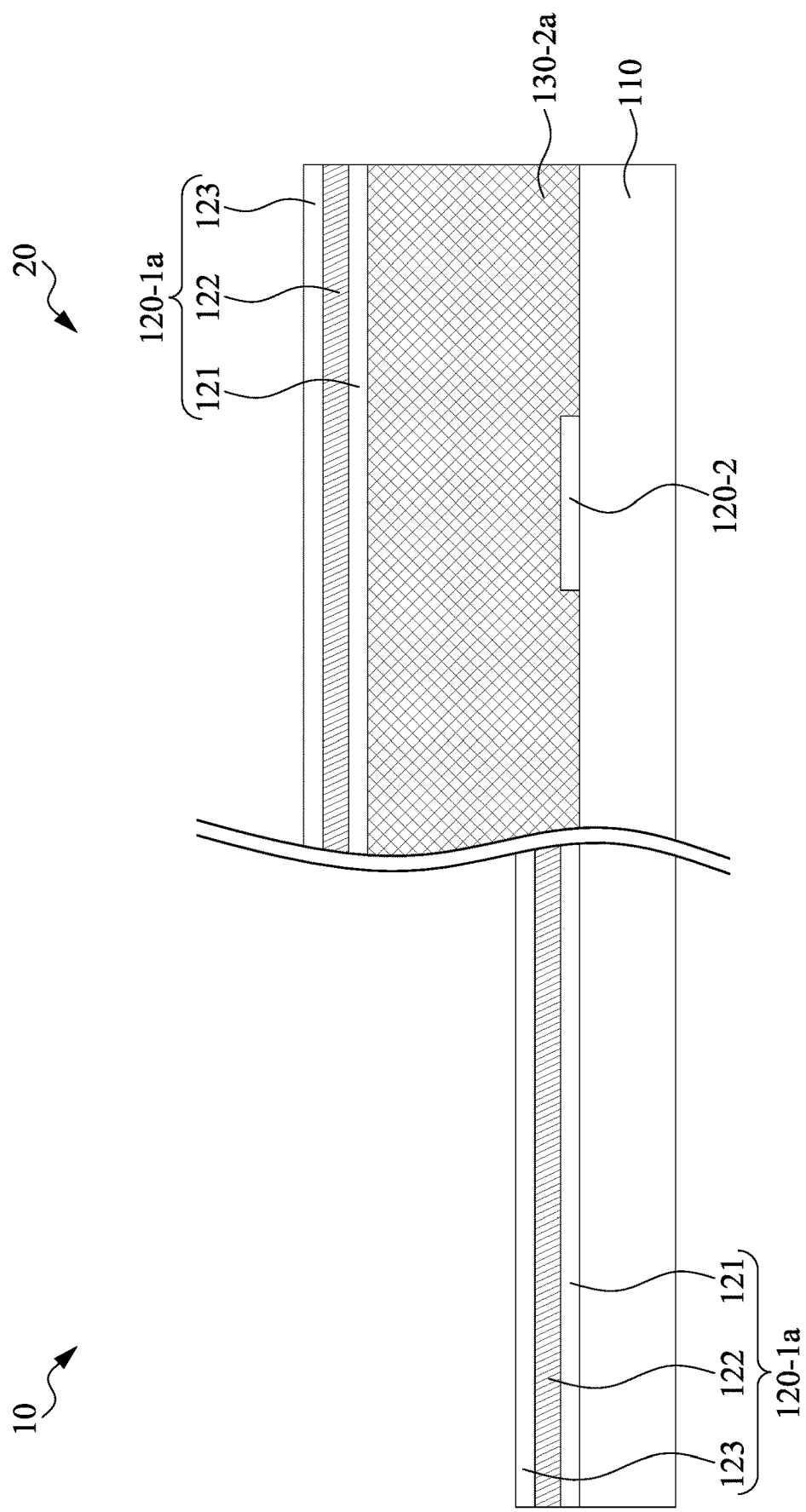

Referring to FIG. 4B and operation 304 in FIG. 3A, a charge trapping dielectric material 120-1a is formed in the region 10 and region 20 to cover the gate electrode material layer 130-2a and the substrate 110. The charge trapping dielectric material 120-1a includes a layer 121 (e.g., SiO$_2$), a layer 122 (e.g., Si$_3$N$_4$) on the layer 121, and a layer 123 (e.g., SiO$_2$) on the layer 122. The layer 121 can be in contact with the substrate 110 in the region 10. The layer 121 can be formed by a thermal growth process or by way of a deposition process (e.g., CVD, PVD, and/or ALD). The layer 122 and layer 123 can be formed by way of deposition processes (e.g., CVD, PVD, and/or ALD). The layers 121, 122, 123 may also be referred to as a tunnel dielectric layer, a charge trapping layer, and a blocking dielectric layer, respectively. In some embodiments, the layers 121 and 122 located in the region 20 are substantially removed.

Referring to FIG. 4C and operation 306 in FIG. 3A, a gate electrode material layer 130-1a is formed in the region 10 and region 20. The gate electrode material layer 130-1a covers the charge trapping dielectric material 120-1a and the gate electrode material layer 130-2a. The gate electrode material layer 130-1a may be formed by a deposition process (e.g., CVD, PVD, and/or ALD). The material of the gate electrode material layer 130-1a may be the same as or different from the gate electrode material layer 130-2a.

Figure 4D:
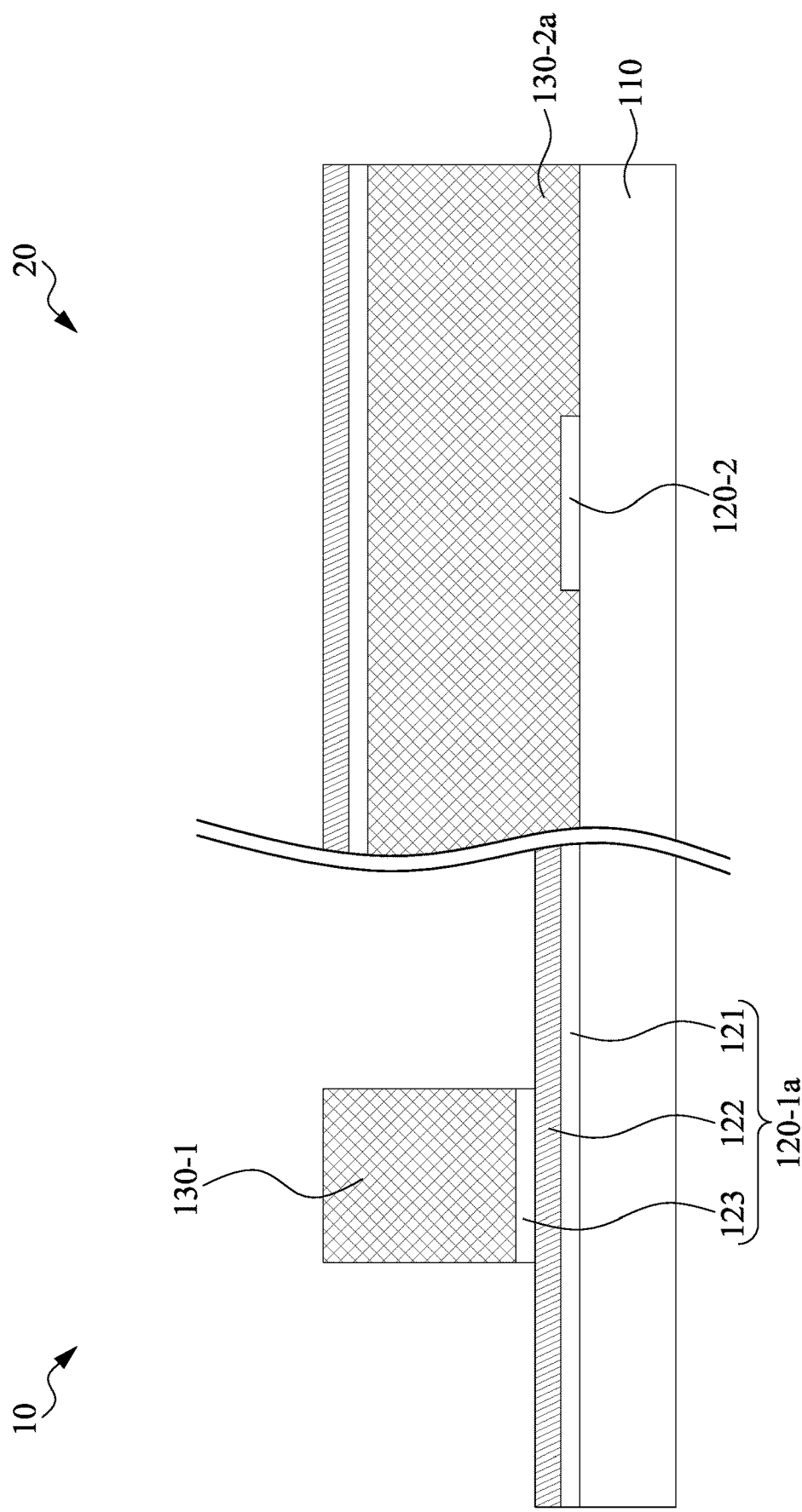

Referring to FIG. 4D and operation 308 in FIG. 3A, the gate electrode material layer 130-1a is patterned such that the gate electrode 130-1 is formed. The gate electrode material layer 130-1a located in the region 20 is removed. Further, the layer 123 is also patterned, and the remaining portion of the layer 123 is covered by the gate electrode 130-1. The layer 123 located in the region 20 is substantially removed. The gate electrode material layer 130-1a and the layer 123 can be removed by, for example, wet etching, dry etching or other suitable processes.

Figure 4E:
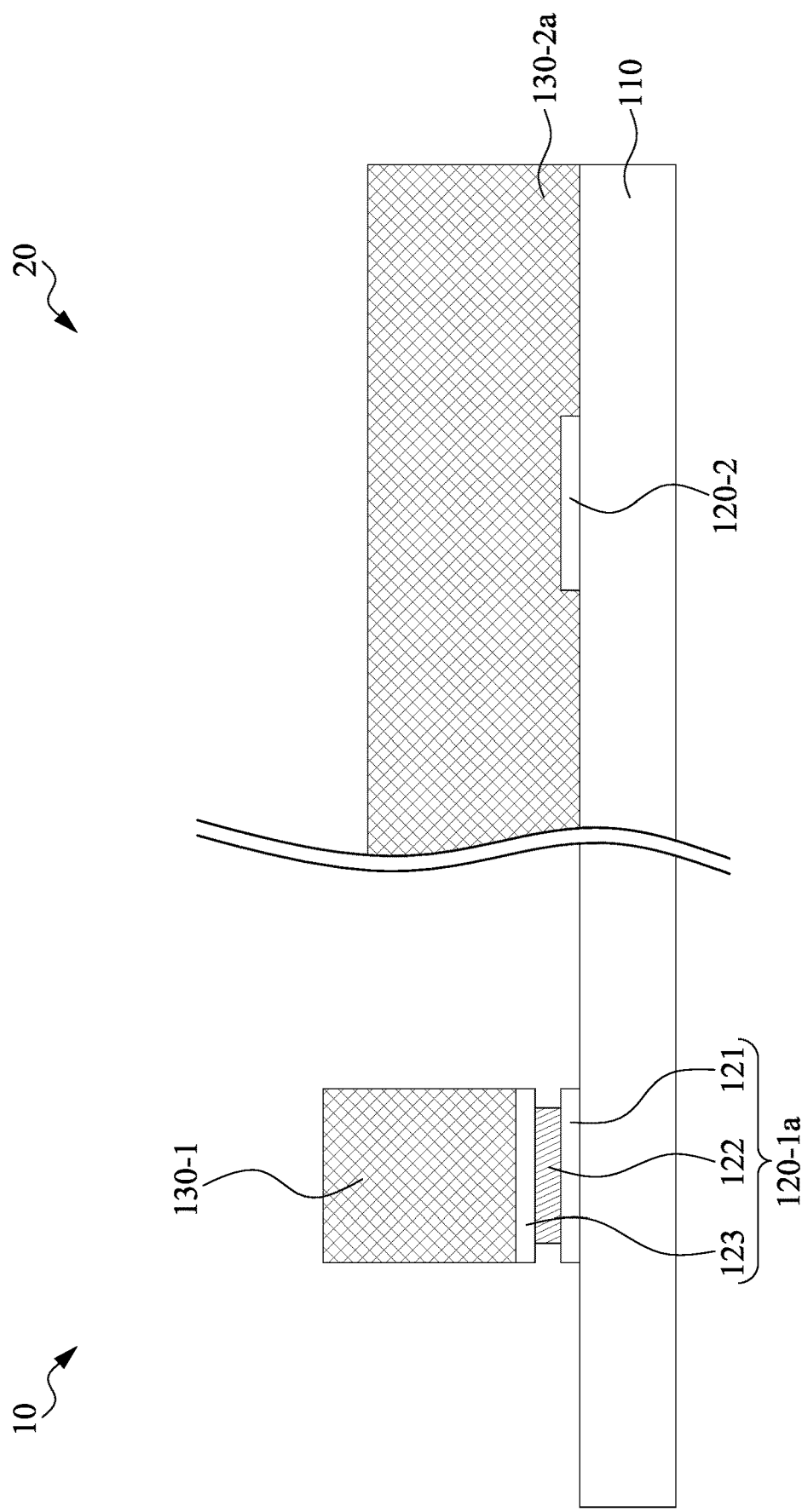

Referring to FIG. 4E and operation 310 in FIG. 3A, the layer 122 is patterned such that the layer 121 is exposed. The layer 122 located in the region 20 is removed. The layer 122 can be removed by, for example, wet etching, dry etching or other suitable processes. For example, the layer 122 can be removed by wet etching process which uses etchant of H$_3$PO$_4$. In some embodiments, the layer 121 is patterned after the layer 121 is patterned, and a gate dielectric 120-1a is formed. The layer 121 is patterned with an etchant different from H$_3$PO$_4$, such as HF. In some other embodiments, the layer 121 is not patterned in this stage. The layer 121 can be patterned in a suitable stage, and the present disclosure is not intended to be limiting.

Figure 4F:
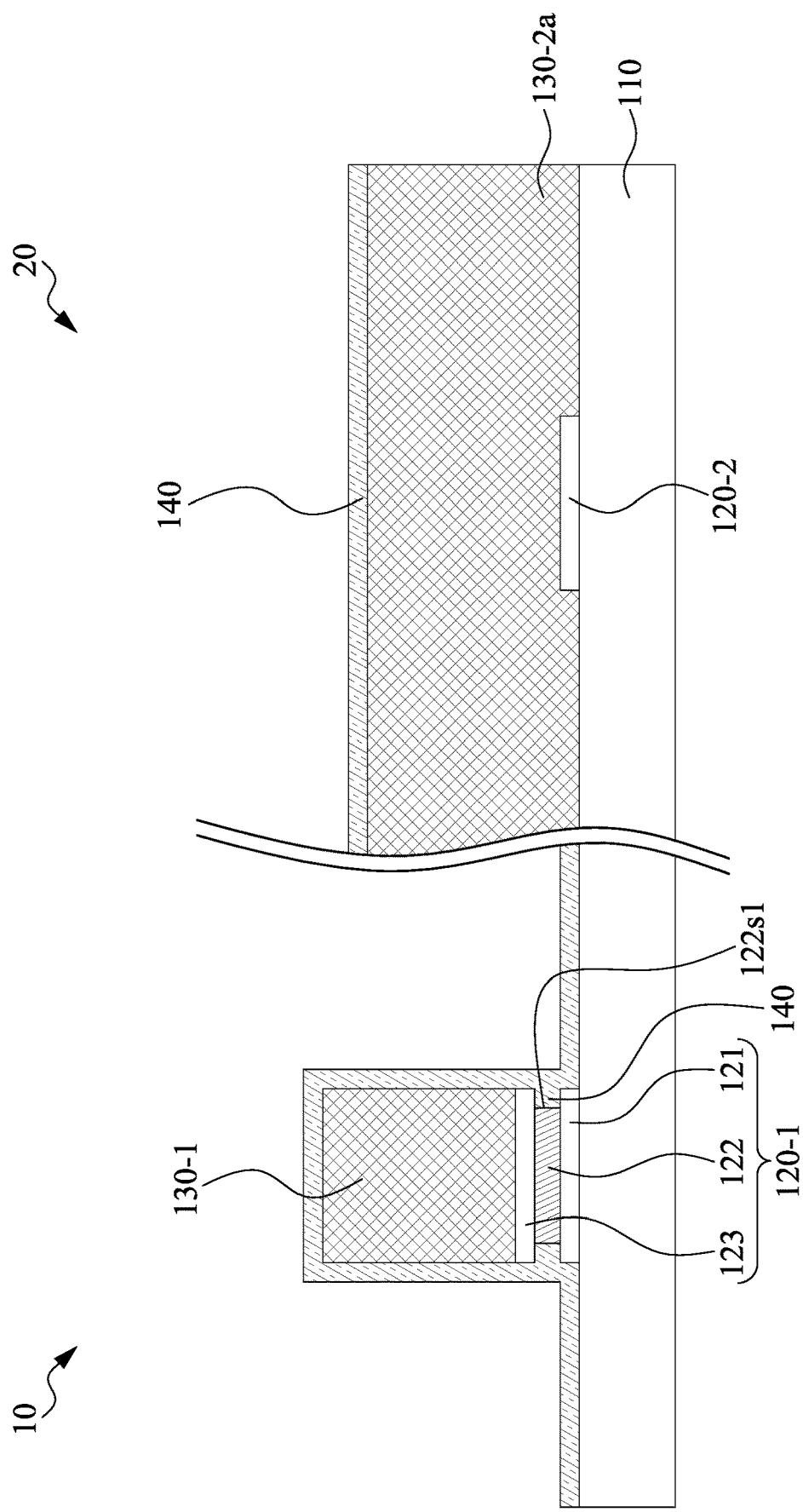

Referring to FIG. 4F and operation 312 in FIG. 3A, a protective layer 140 is formed to cover the lateral surface 122s1 of the layer 122. The protective layer 140 is formed in the regions 10 and 20. The protective layer 140 also covers the top surface and lateral surface of the gate electrode 130-1. The protective layer 140 is configured to protect the layer 122 from being etched in the subsequent stages. The material of the protective layer 140 can be different from that of the layer 122. In comparison with the layer 122, the protective layer 140 has a relatively greater resistance to etchant using H$_3$PO$_4$. The protective layer 140 can be formed by a deposition process (e.g., CVD, PVD, and/or ALD).

Figure 4G:
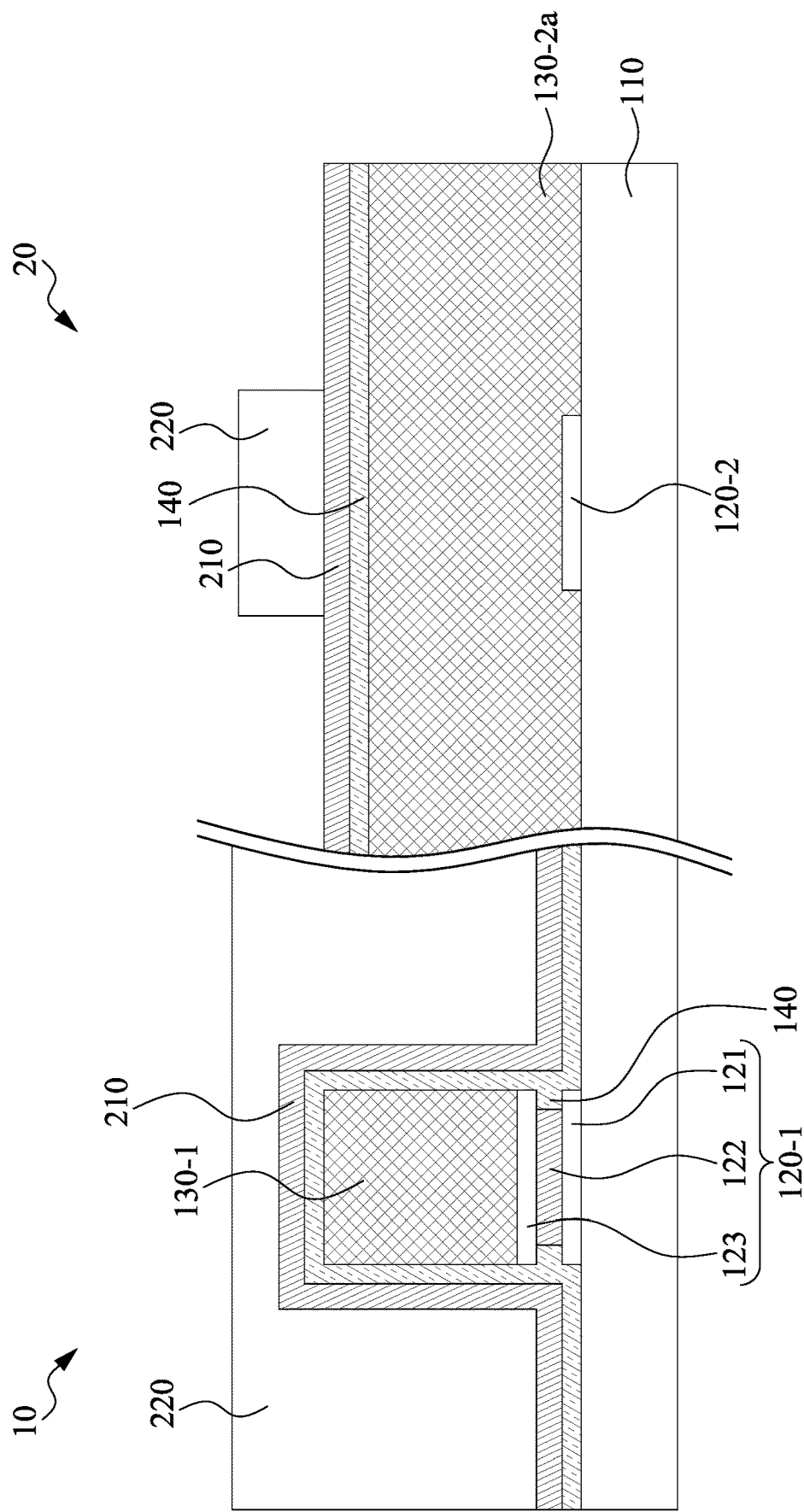

Referring to FIG. 4G and operation 314 in FIG. 3A, a mask layer 210 is formed on the region 10 and region 20 to cover the protective layer 140. Further, an optical-sensitive pattern 220 is formed on the mask layer 210. In some embodiments, the mask layer 210 may include nitrogen-containing material, such as silicon nitride, oxynitride or other suitable materials. In comparison with the mask layer 210, the protective layer 140 has a relatively greater resistance to etchant using H$_3$PO$_4$. The optical-sensitive pattern 220 can be used to define the pattern of the gate electrode material layer 130-2a. The optical-sensitive pattern 220 covers the region 10, and a portion of the mask layer 210 can be exposed from the optical-sensitive pattern 220. In some embodiments, an anti-reflection layer (not shown) is formed to cover the mask layer 210. The anti-reflection layer may include, for example, oxide or other suitable materials.

Figure 4H:
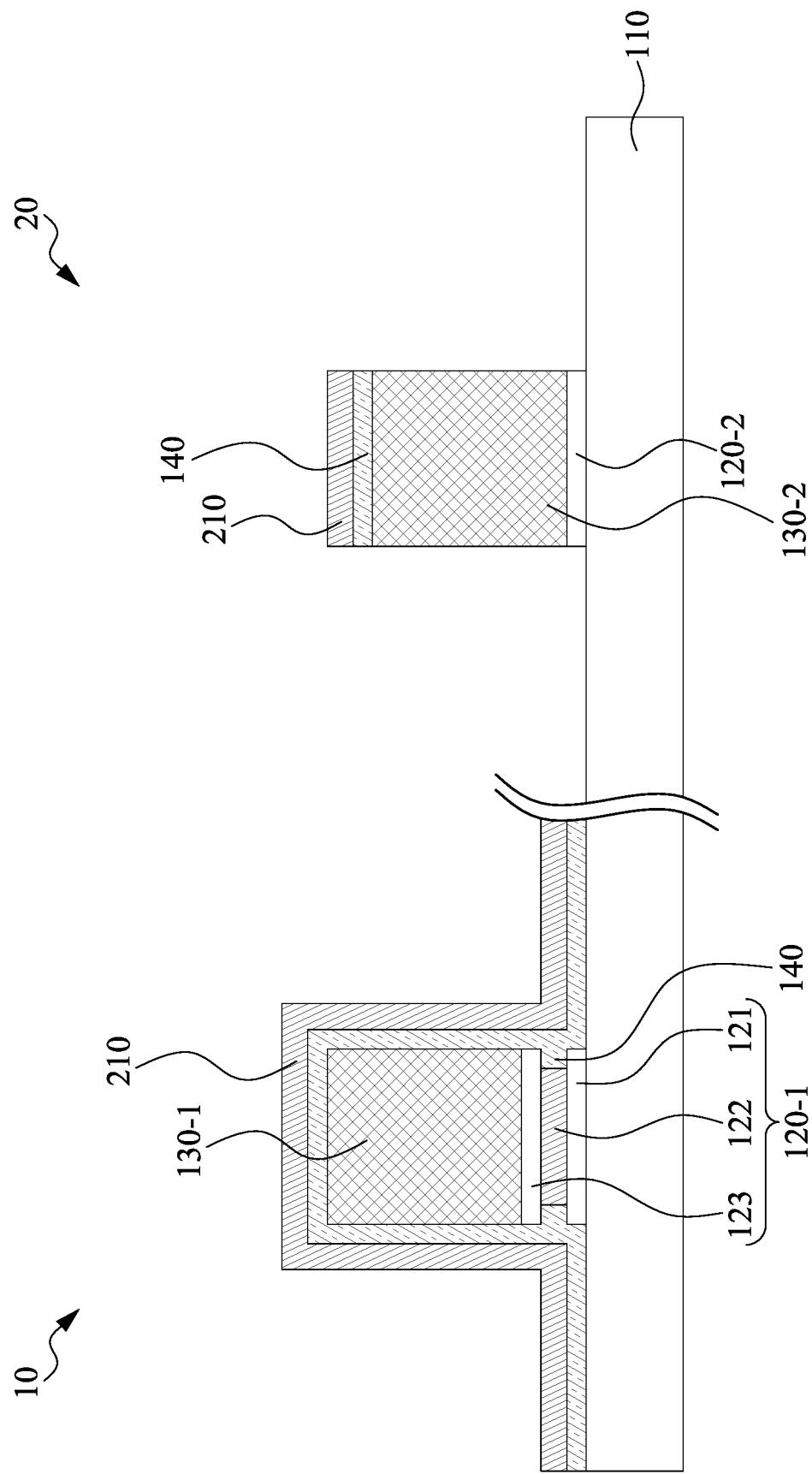

Referring to FIG. 4H and operation 316 in FIG. 3B, the gate electrode material layer 130-2a is patterned such that the gate electrode 130-2 is formed. In some embodiments, the mask layer 210 and the protective layer 140 in the region 20 are also patterned to cover the top surface of the gate electrode 130-2. The lateral surface of the gate electrode 130-2 is free from being covered by each of the protective layer 140 and the mask layer 210. Further, the optical-sensitive pattern 220 is removed. In the region 10, the mask layer 210 remains and covers the protective layer 140 in this stage.

Figure 4I:
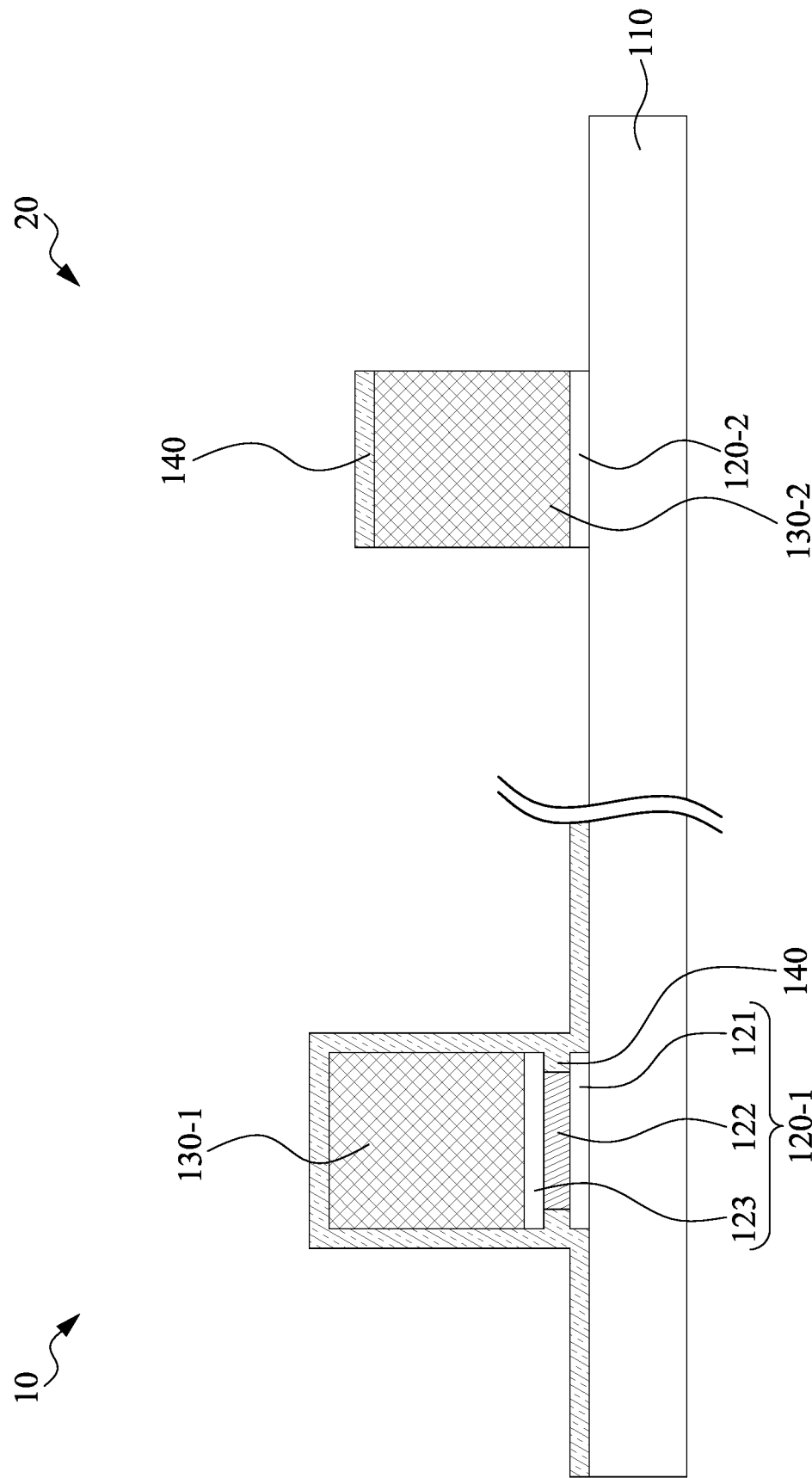

Referring to FIG. 4I and operation 318 in FIG. 3B, the mask layer 210, in the regions 10 and 20, is removed. The protective layer 140 is exposed. The mask layer 210 can be removed by wet etching, dry etching or other suitable processes. In some embodiments, the mask layer 210 is removed by etchant including H$_3$PO$_4$. Since the protective layer 140 has a relatively greater resistance to H$_3$PO$_4$, the protective layer 140 is substantially not etched or etched with less amount. In the embodiments in which the layer 122 is made of nitride, the layer 122 has a relatively smaller resistance to the etchant including H$_3$PO$_4$. Since the lateral surface of the layer 122 is protected by the protective layer 140, the layer 122 can be free from being etched in this stage.

Figure 4J:
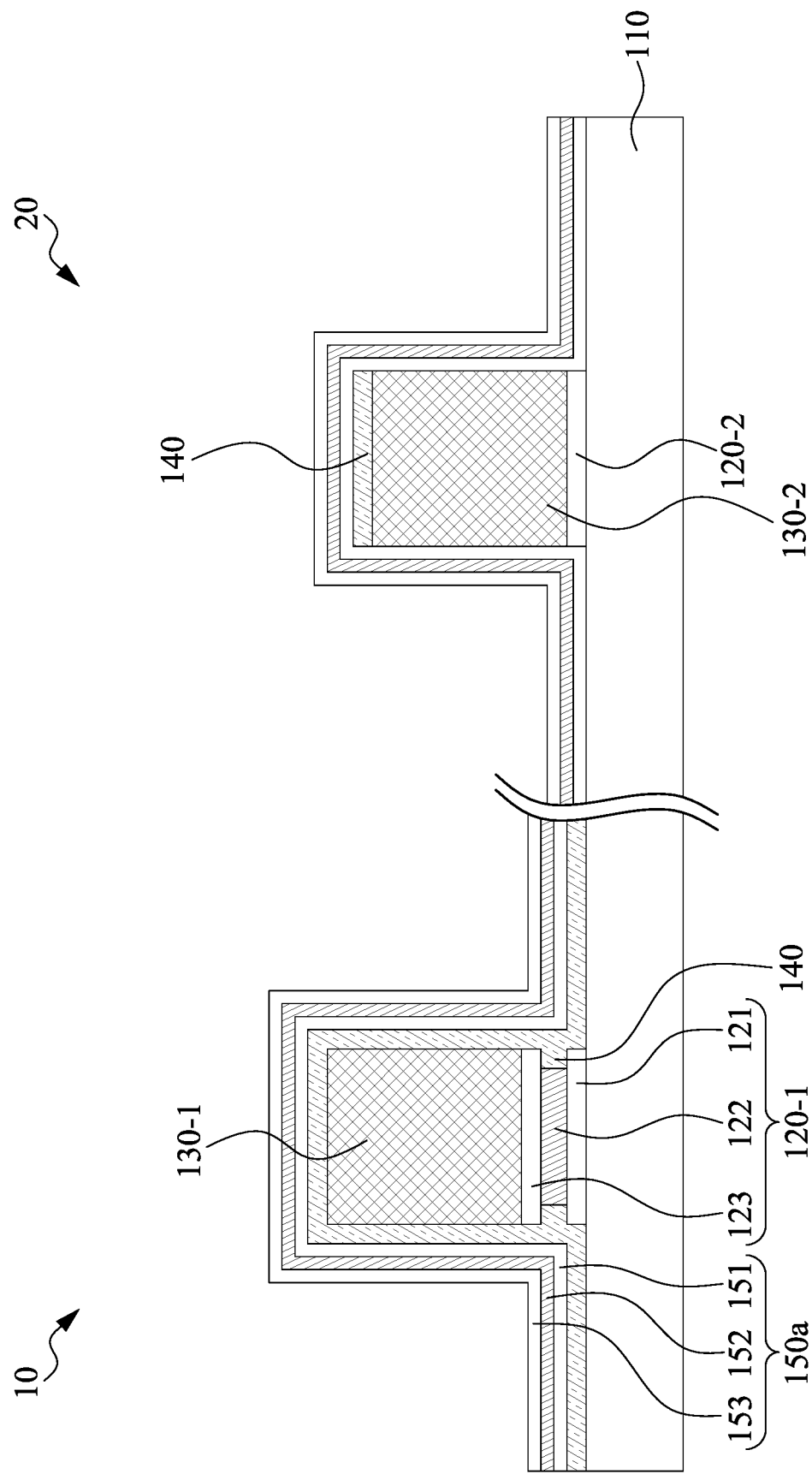

Referring to FIG. 4J and operation 320 in FIG. 3B, a spacer dielectric material 150a is formed on the region 10 and region 20. The protective layer 140 is covered by the spacer dielectric material 150a. The lateral surface of the gate electrode 130-2 is covered by the spacer dielectric material 150a. The spacer dielectric material 150a includes a dielectric layer 151 (e.g., SiO$_2$), a dielectric layer 152 (e.g., Si$_3$N$_4$) on the dielectric layer 151, and a dielectric layer 153 (e.g., SiO$_2$) on the dielectric layer 152. Each of the dielectric layers 151, 152, and 153 can be formed by a deposition process (e.g., CVD, PVD, and/or ALD).

Figure 4K:
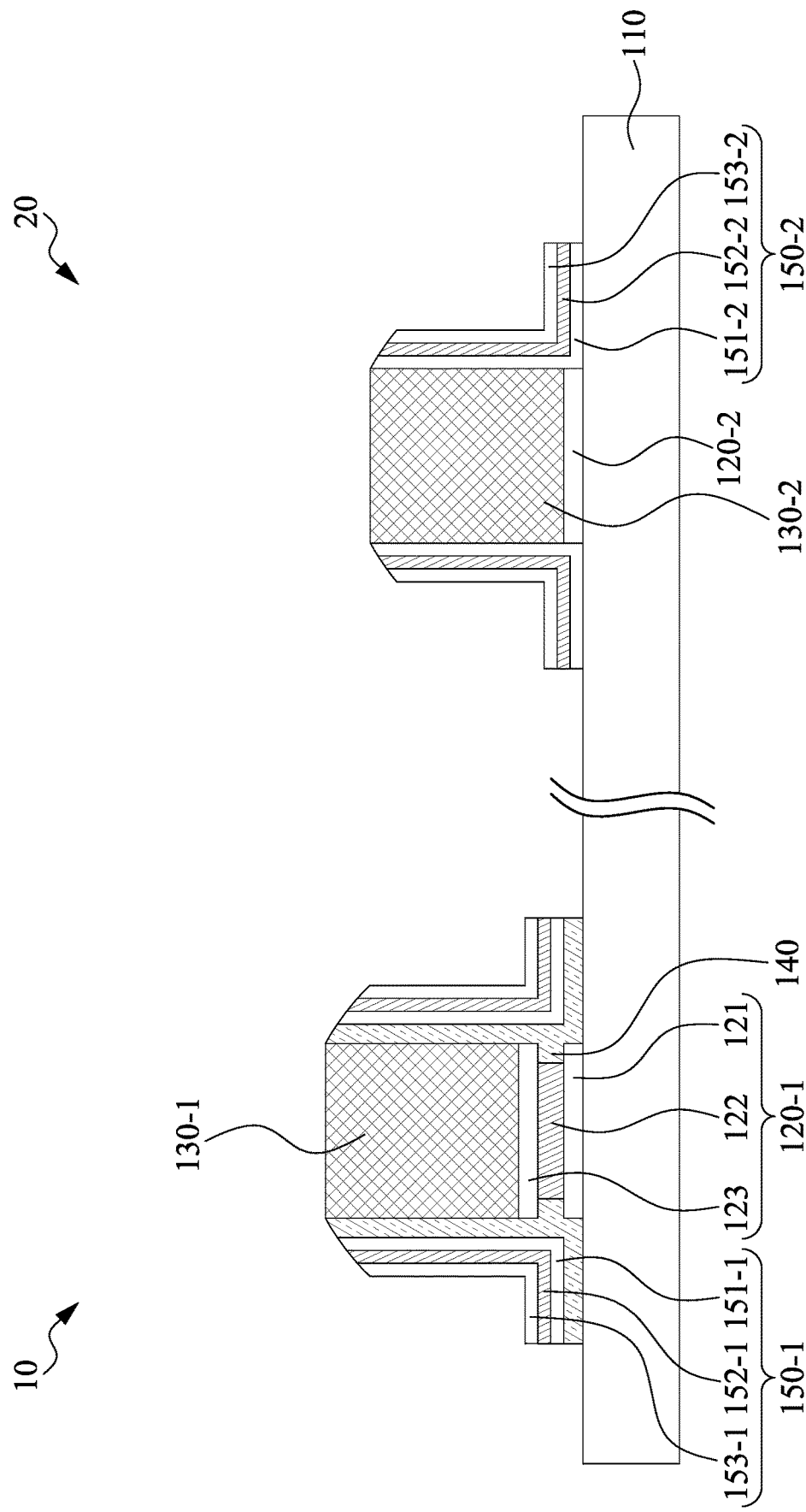

Referring to FIG. 4K and operation 322 in FIG. 3B, the spacer dielectric material 150a is patterned such that sidewall structures 150-1 and 150-2 are formed. Further, the protective layer 140 on the top surface of the gate electrode 130-1 and on the top surface of the gate electrode 130-2 is removed such that the protective layer 140 remains on the lateral surface of the gate electrode 130-1, and the gate electrode 130-2 is free from being covered by the protective layer 140.

Figure 4L:
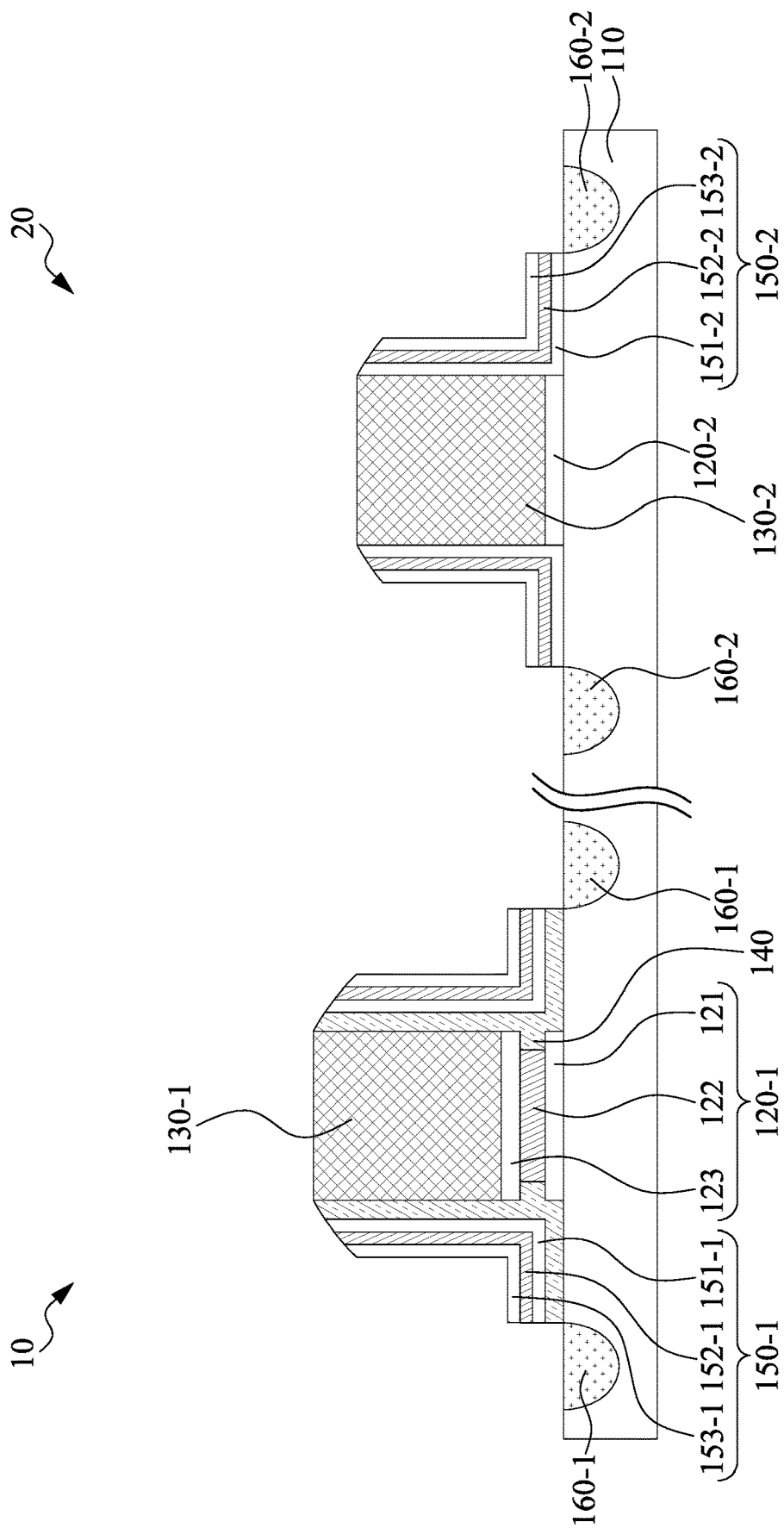

Referring to FIG. 4L and operation 324 in FIG. 3B, source/drain regions 160-1 and 160-2 are formed in the region 10 and region 20. The source/drain regions 160-1 and 160-2 may be formed by performing implant process or other suitable processes.

Figure 4M:
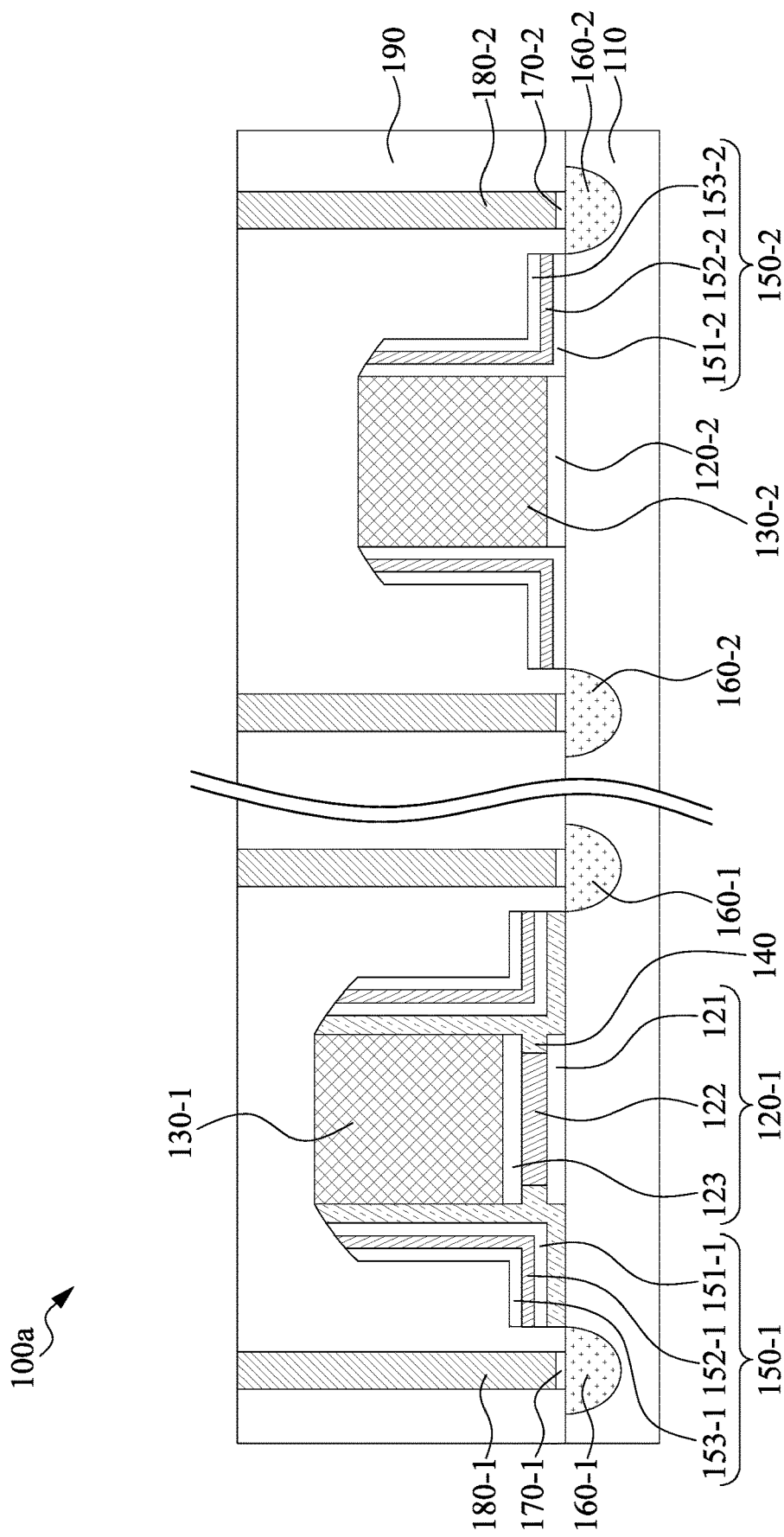

Referring to FIG. 4M and operation 326 in FIG. 3B, silicide structures 170-1, 170-2, contacts 180-1, 180-2, and ILD 190 are formed, and a semiconductor device 100a as shown in FIG. 1 is produced. The silicide structure 170-1 is formed on the source/drain regions 160-1, and the silicide structure 170-2 is formed on the source/drain regions 160-2. The ILD 190 may be formed, and a portion of the ILD 190 may be removed to define openings. A conductive material may fill in the openings such that the contact 180-1 is formed on the silicide structure 170-1, and the contact 180-2 is formed on the silicide structure 170-2.

In a comparative example, the protective layer is not formed. In such a condition, during the stage in which the mask layer, which is made of SiON, is removed, the charge trapping layer, which is made $Si_3N_4$, is also be etched. As a result, the reliability of the flash memory cell device is degraded. In the present disclosure, the protective layer 140 protects the charge trapping layer (e.g., the layer 122 as shown in FIG. 1) from being etched, and the reliability of the flash memory cell device can be improved. Further, the formation of the protective layer 140 can also be used in the flow of integrating the flash memory cell device and the logic device. Therefore, the baseline performance of the semiconductor device is substantially uninfluenced.

Some embodiments of the present disclosure provide a semiconductor device. The semiconductor device includes a substrate and a first gate electrode disposed on the substrate and located in a first region of the semiconductor device. The semiconductor device also includes a first sidewall structure covering the first gate electrode. The semiconductor device further includes a protective layer disposed between the first gate electrode and the first sidewall structure. In addition, the semiconductor device includes a second gate electrode disposed on the substrate and located in a second region of the semiconductor device. The semiconductor device also includes a second sidewall structure covering a lateral surface of the second gate electrode.

Some embodiments of the present disclosure provide a semiconductor device. The semiconductor device includes a substrate. The semiconductor device also includes a first gate electrode disposed on the substrate. The semiconductor device further includes a first sidewall structure covering a lateral surface of the first gate electrode. In addition, the semiconductor device includes a second gate electrode disposed on the substrate. The semiconductor device also includes a second sidewall structure covering a lateral surface of the second gate electrode. The first width of the first sidewall structure is different from the second width of the second sidewall structure.

Some embodiments of the present disclosure provide a method of manufacturing a semiconductor device. The semiconductor device has a first region and a second region. The method includes: forming a first gate dielectric structure on a substrate in the first region; forming a second gate dielectric structure on the substrate in the second region; forming a first gate electrode on the first gate dielectric structure; forming a second gate electrode on the second gate dielectric structure; forming a protective layer on the first region and the second region to cover the first gate electrode, the second gate electrode and a lateral surface of the first gate dielectric structure; and removing the protective layer on the second gate electrode.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a substrate;
a first gate electrode disposed on the substrate and located in a first region of the semiconductor device;
a first dielectric structure disposed between the first gate electrode and the substrate, wherein the first dielectric structure defines a recess recessed from a lateral surface of the first dielectric structure;
a first sidewall structure covering the first gate electrode, wherein the first sidewall structure comprises a first dielectric layer filling the recess, and the first dielectric layer has a first width between a lateral surface of the first gate electrode and a lateral surface of the first dielectric layer;
a second gate electrode disposed on the substrate and located in a second region of the semiconductor device; and
a second sidewall structure covering the second gate electrode, wherein the second sidewall structure comprises a second dielectric layer abutting the second gate electrode, and the second dielectric layer has a second width between a lateral surface of the second gate electrode and a lateral surface of the second dielectric layer, and wherein the second width is less than the first width.

2. The semiconductor device of claim 1, wherein the first dielectric layer is in contact with the first gate electrode.

3. The semiconductor device of claim 2, wherein the second dielectric layer is in contact with the second gate electrode.

4. The semiconductor device of claim 1, wherein a material of the first dielectric layer is the same as a material of the second dielectric layer.

5. The semiconductor device of claim 1, wherein the first dielectric structure comprises a first layer, a second layer on the first layer, and a third layer on the second layer, and the second layer is recessed from the first layer and the third layer to define the recess.

6. The semiconductor device of claim 5, wherein a material of the first layer is the same as a material of the first dielectric layer.

7. The semiconductor device of claim 5, wherein a material of the third layer is the same as a material of the first dielectric layer.

8. The semiconductor device of claim 1, further comprising:
a second dielectric structure between the second gate electrode and the substrate,
wherein a composition of the first dielectric structure is different from a composition of the second dielectric structure.

9. A semiconductor device, comprising:
a substrate;
a first gate electrode disposed on the substrate and located in a first region of the semiconductor device;
a first dielectric structure disposed between the first gate electrode and the substrate;
a first sidewall structure covering the first gate electrode, wherein the first sidewall structure comprises a first dielectric layer abutting the first gate electrode, and the first dielectric layer has a first width between a lateral surface of the first gate electrode and a lateral surface of the first dielectric layer;
a second gate electrode disposed on the substrate and located in a second region of the semiconductor device;
a second dielectric structure disposed between the second gate electrode and the substrate, wherein a composition of the first dielectric structure is different from that of the second dielectric structure; and a second sidewall structure covering the second gate electrode, wherein the second sidewall structure comprises a second dielectric layer abutting the second gate electrode, and the second dielectric layer has a second width, less than the first width, between a lateral surface of the second gate electrode and a lateral surface of the second dielectric layer.

10. The semiconductor device of claim 9, wherein a thickness of the second dielectric structure is less than a thickness of the first dielectric structure.

11. The semiconductor device of claim 9, wherein the first sidewall structure has a third dielectric layer spaced apart from the first gate electrode by the first dielectric layer, and the second sidewall structure has a fourth dielectric layer spaced apart from the second gate electrode by the second dielectric layer, and a distance between the third dielectric layer and the first gate electrode is different from a distance between the fourth dielectric layer and the second gate electrode.

12. The semiconductor device of claim 11, wherein a material of the third dielectric layer is the same as a material of the fourth dielectric layer.

13. The semiconductor device of claim 9, wherein the first dielectric layer comprises a protruding portion protruding toward the first dielectric structure.

14. The semiconductor device of claim 13, wherein the first dielectric structure comprises a first layer defining a recess accommodating the protruding portion, and the first layer is spaced apart from the first gate electrode.

15. The semiconductor device of claim 14, wherein the first dielectric structure comprises a second layer between the first layer and the first gate electrode, and a third width of the first layer is less than a fourth width of the second layer.

16. A semiconductor device, comprising:
   a substrate;
   a first gate electrode disposed on the substrate;
   a first dielectric structure disposed between the first gate electrode and the substrate, wherein the first dielectric structure comprises a first dielectric layer and a second dielectric layer between the first dielectric layer and the first gate electrode, and a width of the first dielectric layer is less than a width of the second dielectric layer; and
   a first sidewall structure covering the first gate electrode, wherein the first sidewall structure comprises:
      a first layer having a protruding portion protruding toward the first dielectric layer; and
      a second layer spaced apart from the first gate electrode by the first layer;
   a second gate electrode disposed on the substrate; and
   a second sidewall structure covering the second gate electrode, wherein the second sidewall structure comprises:
      a third layer abutting the second gate electrode; and
      a fourth layer spaced apart from the second gate electrode by the third layer,
   wherein a first height difference between a top of the first gate electrode and a top of the second layer is greater than a second height difference between a top of the second gate electrode and a top of the fourth layer.

17. The semiconductor device of claim 16, wherein the first dielectric layer comprises silicon nitride, and the second dielectric layer comprises silicon oxide.

18. The semiconductor device of claim 16, wherein a lateral surface of the second dielectric layer is substantially aligned with a lateral surface of the first gate electrode.

19. The semiconductor device of claim 16, wherein a material of the second layer is the same as that of the fourth layer.

20. The semiconductor device of claim 16, further comprising:
   a second dielectric structure disposed between the second gate electrode and the substrate, wherein a composition of the first dielectric structure is different from a composition of the second dielectric structure.

* * * * *